US008812755B2

(12) United States Patent
Singh et al.

(10) Patent No.: US 8,812,755 B2
(45) Date of Patent: *Aug. 19, 2014

(54) HETEROGENEOUS HIGH-SPEED SERIAL INTERFACE SYSTEM WITH PHASE-LOCKED LOOP ARCHITECTURE AND CLOCK DISTRIBUTION SYSTEM

(71) Applicant: Altera Corporation, San Jose, CA (US)

(72) Inventors: Surinder Singh, San Jose, CA (US); Wai-Bor Leung, Milpitas, CA (US); Henry Y. Lui, Millbrae, CA (US); Arch Zaliznyak, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/195,201

(22) Filed: Mar. 3, 2014

(65) Prior Publication Data

US 2014/0176188 A1 Jun. 26, 2014

Related U.S. Application Data

(63) Continuation of application No. 13/679,061, filed on Nov. 16, 2012, now Pat. No. 8,700,825.

(51) Int. Cl.
*G06F 1/06* (2006.01)
*H04L 5/22* (2006.01)
(52) U.S. Cl.
USPC ........ 710/60; 710/8; 710/9; 710/10; 713/500; 326/37; 326/38; 327/142; 327/156

(58) Field of Classification Search
USPC ............... 710/8–10, 60; 713/500; 326/37, 38; 327/142, 156
See application file for complete search history.

(56) References Cited

U.S. PATENT DOCUMENTS

| 7,602,212 | B1 * | 10/2009 | Chan et al. ...................... 326/37 |
| 7,698,482 | B2 * | 4/2010 | Venkata et al. ................. 710/60 |
| 7,812,634 | B1 * | 10/2010 | Shumarayev et al. .......... 326/38 |
| 8,188,774 | B1 * | 5/2012 | Krishnamurthy et al. .... 327/142 |
| 8,397,096 | B2 * | 3/2013 | Shumarayev et al. ........ 713/500 |
| 8,464,088 | B1 * | 6/2013 | Nguyen et al. ................ 713/500 |
| 8,477,831 | B2 * | 7/2013 | Vijayaraghavan et al. ... 375/220 |
| 8,488,623 | B2 * | 7/2013 | Duwel et al. .................. 370/465 |
| 8,542,042 | B1 * | 9/2013 | Pham et al. ................... 327/156 |
| 8,571,059 | B1 * | 10/2013 | Zaliznyak et al. ............ 370/464 |
| 8,572,300 | B2 * | 10/2013 | Wu et al. ......................... 710/52 |
| 8,700,825 | B1 * | 4/2014 | Singh et al. ..................... 710/60 |

* cited by examiner

*Primary Examiner* — Tammara Peyton
(74) *Attorney, Agent, or Firm* — Okamoto & Benedicto LLP

(57) ABSTRACT

One embodiment relates to an integrated circuit having a plurality of four-channel serial interface modules. Each of the plurality of four-channel serial interface modules includes a first physical medium attachment (PMA) channel circuit, a second PMA channel circuit adjacent to the first PMA channel circuit, a third PMA channel circuit adjacent to the second PMA channel circuit, a fourth PMA channel circuit adjacent to the third PMA channel circuit, and at least one phase-locked loop (PLL) circuit which is programmably coupled to each of the first, second, third and fourth PMA channel circuits. Other embodiments and features are also disclosed.

20 Claims, 9 Drawing Sheets

HETEROGENEOUS HIGH-SPEED SERIAL INTERFACE SYSTEM WITH PHASE-LOCKED LOOP ARCHITECTURE AND CLOCK DISTRIBUTION SYSTEM

CROSS-REFERENCE TO RELATED APPLICATION(S)

The present application is a continuation of U.S. patent application Ser. No. 13/679,061, filed Nov. 16, 2012, the disclosure of which is hereby incorporated by reference.

BACKGROUND

1. Technical Field

The present invention relates generally to serial interfaces.

2. Description of the Background Art

High-speed serial digital communication is constantly increasing in importance. The number of different industry standards for such communication is also increasing. Programmable logic device ("PLD") technology allows one common hardware design (embodied in an integrated circuit) to be programmed to meet the needs of many different applications. PLDs with a given hardware design can be manufactured in large quantities at low cost. Each user then programs PLDs of that kind to meet that user's particular needs. The user does not have to do a custom integrated circuit design, with the attendant high cost, delay, and difficulty of revision if modifications are subsequently needed.

To facilitate the use of PLDs in applications involving high speed serial digital communication, it would be desirable to provide PLDs with high speed serial interface ("HSSI") circuitry. However, there are a large number of high-speed serial communication standards or somewhat related, but perhaps non-standard, protocols that users of PLDs may want to employ. It would be wasteful and uneconomical to include a large number of different HSSI circuits on a PLD is wasteful, uneconomical, and very difficult or even impossible if the number of standards or protocols to be supported becomes very large. On the other hand, manufacturing the same basic PLD circuitry in several different versions, each with different HSSI circuitry to meet a different HSSI standard or protocol, is also uneconomical because it is contrary to the "economy of scale" benefit otherwise associated with manufacturing one common PLD circuit design in large volume.

SUMMARY

One embodiment relates to an integrated circuit having a plurality of four-channel serial interface modules. Each of the plurality of four-channel serial interface modules includes four physical medium attachment (PMA) channel circuits which are arranged next to each other in a linear arrangement in the physical layout of the integrated circuit. The module further includes at least one phase-locked loop (PLL) circuit which is programmably coupled to each of the four PMA channel circuits.

Another embodiment relates to a four-channel serial interface circuit module. The module includes four PMA channel circuits which are arranged next to each other in a linear arrangement in the physical layout of the integrated circuit. The module further includes at least one PLL circuit. At least one of the four PMA channel circuits is programmable to one of a data-channel configuration and a clock-multiplier-unit configuration.

Another embodiment relates to a method of programming an integrated circuit. A plurality of four-channel serial interface modules are programmed to implement a plurality of different serial interface protocol, each of the plurality of four-channel serial interface modules having four PMA channel circuits, four PCS circuits programmably coupled to the four PMA channel circuits, and at least one phase-locked loop (PLL) circuit which is programmably coupled to the four PMA channel circuits.

Other embodiments and features are also disclosed.

DETAILED DESCRIPTION

The present application discloses, among other inventive concepts, an advantageous heterogeneous HSSI system architecture. The system architecture is heterogeneous in that it may be programmed to be used with various different HSSI standards and protocols. As such, the system architecture may be advantageously applied to programmable integrated circuits. Programmable integrated circuits include field programmable gate arrays and other PLDs and may also include programmable application specific integrated circuits, programmable microcontrollers, programmable digital signal processors, and other programmable integrated circuits.

The system architecture includes a four-channel (four-pack) high-speed serial interface (HSSI) module. It has been determined by applicants that arranging the HSSI circuitry in four-channel modules as disclosed herein provides a superior HSSSI resource-ratio and increased area efficiency. This improves fitting of wire-line and computing applications while lowering die costs.

Figure 1:
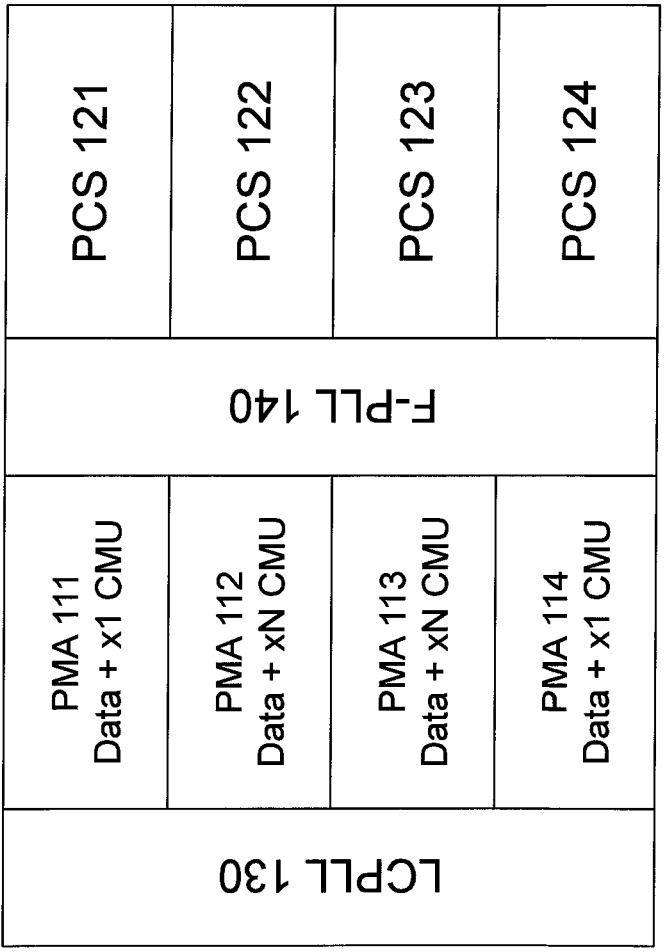
FIG. 1 is a schematic diagram depicting a four-channel high-speed serial interface module on an integrated circuit in accordance with an embodiment of the invention.

FIG. 1 is a schematic diagram depicting a four-channel high-speed serial interface module 100 on an integrated circuit in accordance with an embodiment of the invention. As shown, the four-channel module 100 includes an array of four PMA channel circuits (111, 112, 113, and 114) and a corresponding array of four physical coding sub-layer (PCS) channel circuits (121, 122, 123, and 124).

The four PMA channel circuits are adjacent to each other in the physical layout of the integrated circuit. Similarly, the four PCS channel circuits are also adjacent to each other in the physical layout of the integrated circuit. Each PCS channel circuit (121, 122, 123, and 124) may be communicatively connected to the corresponding PMA channel circuit (111, 112, 113 and 114, respectively).

Each PMA/PCS channel may process signals for a stream of data. The PCS circuitry generally provides digital logic functions which implement data communication protocols, while the PMA circuitry generally provides mixed (analog/digital) signal functionality for the data communications. For example, for certain protocols, the PCS circuitry may be configured to perform, among other functions, 8-bit (octet) to 10-bit encoding for data to be sent to the PMA circuitry and 10-bit to 8-bit decoding for data received from the PMA circuitry. The PMA circuitry may be configured to perform, among other functions, serialization of data to be transmitted (conversion from parallel to serial) and de-serialization of received data (conversion from serial to parallel).

In accordance with an embodiment of the invention, each PMA channel circuit (111,112, 113, and 114) is programmable to a data-channel (Data) configuration or a clock-multiplier-unit (CMU) configuration. In the particular embodiment depicted in FIG. 1, the first PMA channel circuit 111 and the fourth PMA channel circuit 114 are each a CMU with a reach or span of one channel (x1), and the second PMA channel circuit 112 and the third PMA channel circuit 113 are each a CMU with a reach or span of N channels (xN). In general, N may be two or more. In one embodiment, N may be configurable to a multiple of four (up to a predetermined maximum). In another embodiment, N may also be configurable to be six. A reach or span of one channel means that a clock signal originating at a CMU may drive a channel that is one channel away from (i.e. adjacent to) that CMU. A reach or span of N channels means that a clock signal originating at a CMU may drive a channel that is N channels away from that CMU in a linear array of channels.

The four-channel module 100 may further include two PLL circuits: a low-jitter PLL (LCPLL) circuit 130 and a PLL circuit (F-PLL) 140 which is one of two PLLs in a fracture-able PLL circuit. The LCPLL circuit 130 may be implemented using an LC oscillator (which includes an inductor L and a capacitor C). An example of a fracture-able PLL circuit 500 is described below in relation to FIG. 5.

The array of PMA channel circuits (111,112, 113, and 114) may be arranged between the LCPLL circuit 130 and the F-PLL circuit 140 in the physical layout of the integrated circuit. The F-PLL circuit 140 may be arranged between the array of PMA channel circuits (111,112, 113, and 114) and the array of PCS channel circuits (121, 122, 123, and 124) in the physical layout of the integrated circuit.

Figure 2:
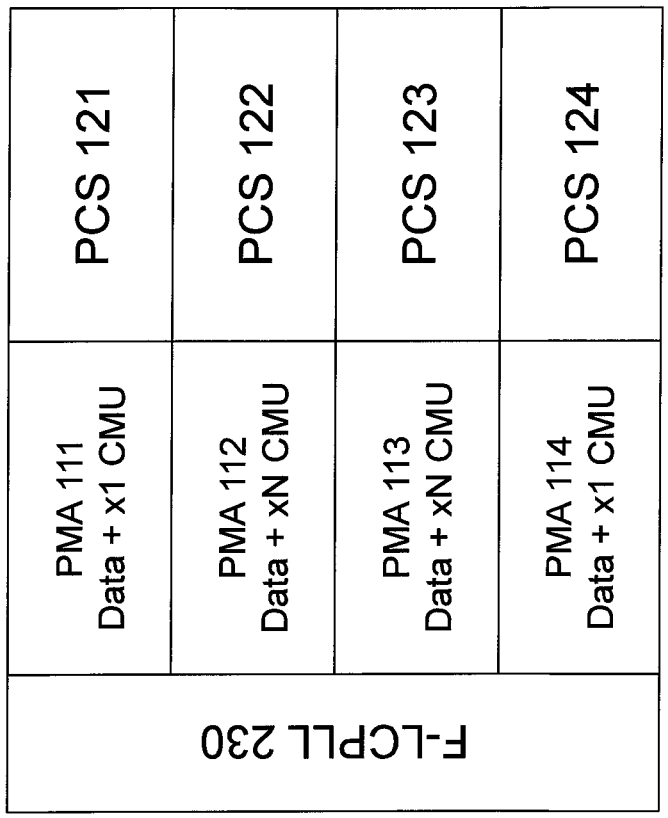
FIG. 2 is a schematic diagram depicting a four-channel high-speed serial interface module on an integrated circuit in accordance with an alternate embodiment of the invention.

FIG. 2 is a schematic diagram depicting a four-channel high-speed serial interface module 200 on an integrated circuit in accordance with an alternate embodiment of the invention. In this embodiment, the four-channel module 200 includes a low-jitter PLL (F-LCPLL) circuit 230 which is one of two PLLs in a fracture-able low-jitter PLL circuit. An example of a fracture-able PLL circuit 500 is described below in relation to FIG. 5. In this case, each of the two PLLs in the fracture-able PLL circuit 500 is a low-jitter PLL. The low-jitter PLL may be an LC oscillator based. As shown, in this embodiment, the array of PMA channel circuits (111,112, 113, and 114) may be arranged between the F-LCPLL circuit 230 and the array of PCS channel circuits (121, 122, 123, and 124) in the physical layout of the integrated circuit.

Figure 3:
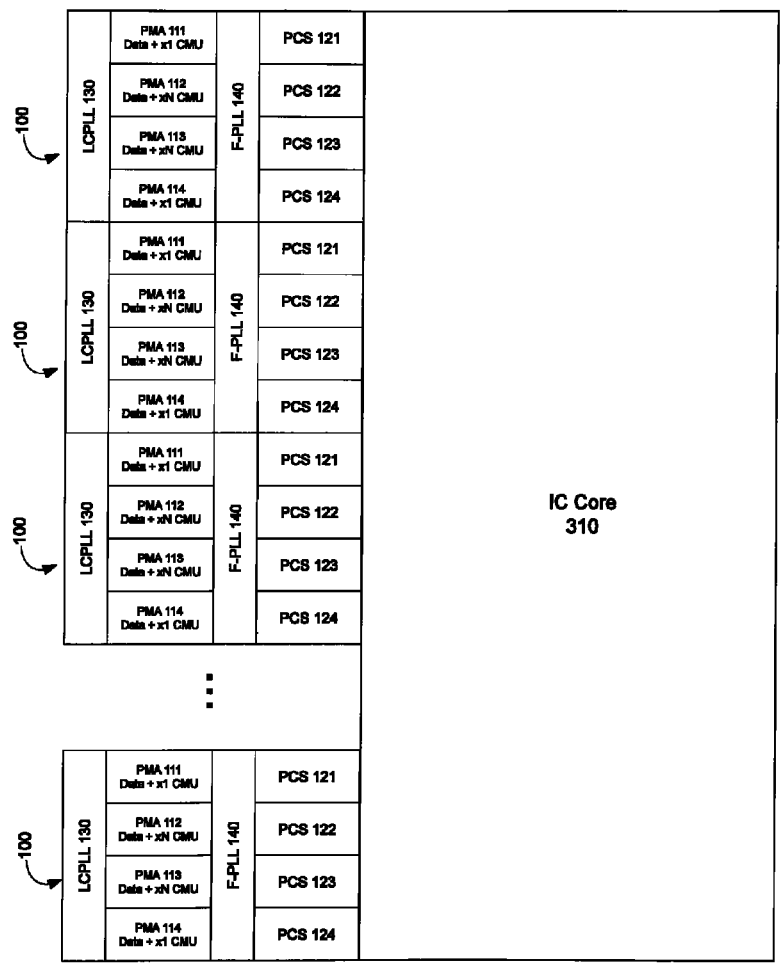
FIG. 3 is a schematic diagram depicting an integrated circuit including multiple four-channel high-speed serial interface modules in accordance with an embodiment of the invention.

FIG. 3 is a schematic diagram depicting an integrated circuit 300 including multiple four-channel high-speed serial interface modules 100 in accordance with an embodiment of the invention. As shown, the integrated circuit (IC) 300 may include an IC core 310 and the multiple four-channel modules 100 on a side of the IC core 310. While the four-channel modules 100 are shown on one side of the IC core 310 in the embodiment illustrated, the four-channel modules 100 may be distributed on two or more sides of the IC core 310 in other embodiments, such as, for example, on two opposing sides. Each four-channel module 100 may include the four PMA channel circuits (111, 112, 113 and 114), the four PCS channel circuits (121, 122, 123, and 124), the LCPLL 130, and the F-PLL 140 as described above in relation to FIG. 1.

Figure 4:
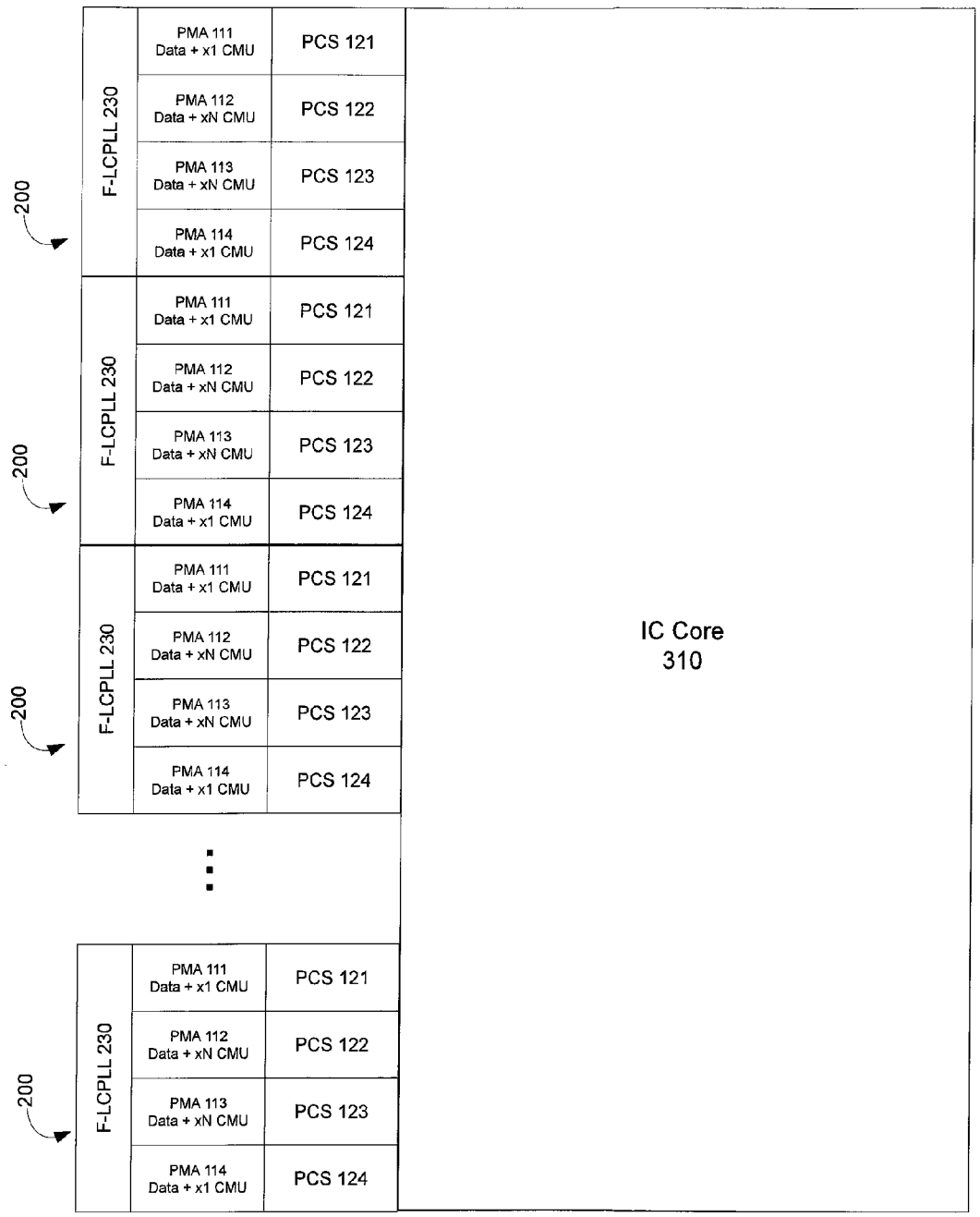
FIG. 4 is a schematic diagram depicting an integrated circuit including multiple four-channel high-speed serial interface modules in accordance with an alternate embodiment of the invention.

FIG. 4 is a schematic diagram depicting an integrated circuit 400 including multiple four-channel high-speed serial interface modules 200 in accordance with an alternate embodiment of the invention. As shown, the IC 400 may include an IC core 310 and the multiple four-channel modules 200 on a side of the IC core 310. While the four-channel modules 200 are shown on one side of the IC core 310 in the embodiment illustrated, the four-channel modules 200 may be distributed on two or more sides of the IC core 310 in other embodiments, such as, for example, on two opposing sides. Each four-channel module 200 may include the four PMA channel circuits (111, 112, 113 and 114), the four PCS channel circuits (121, 122, 123, and 124), and the F-LCPLL 230 as described above in relation to FIG. 2.

In one particular embodiment, the IC (300 or 400) in FIG. 3 or 4 may be a field programmable gate array (FPGA) or other programmable logic device (PLD). In such an embodiment, the IC core 310 may include the core fabric of the FPGA or other PLD.

Figure 5:
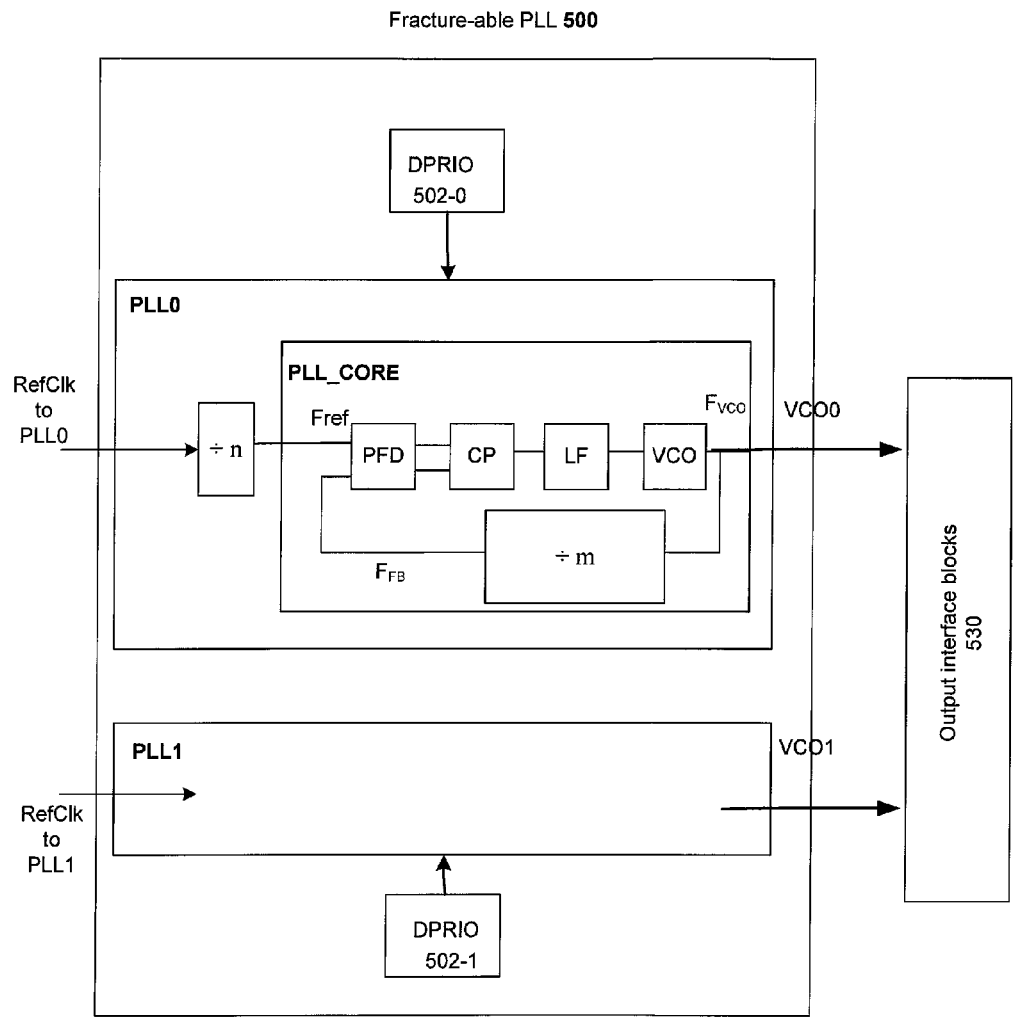
FIG. 5 depicts a fracture-able phase-locked loop (PLL) circuit in accordance with an embodiment of the invention.

FIG. 5 depicts an example fracture-able PLL circuit 500 in accordance with an embodiment of the invention. As shown, the fracture-able PLL 500 includes two PLLs and various other circuit blocks.

The fracture-able PLL 500 may be configured as a single PLL. When configured as a single PLL, the clock output may be switched between the VCOs of PLL0 and PLL1 dynamically, or the two PLLs may be cascaded internally. Alternatively, the fracture-able PLL 500 may be configured as two separate PLLs for separate uses.

The two PLLs within the fracture-able PLL 500 are labeled as PLL0 and PLL1. For purposes of simplified illustration, circuit details are shown only within PLL0, but PLL1 may be implemented similarly. The circuits within each PLL may include, for example, a pre-scale divide counter (÷n), a PLL core (PLL_CORE), and various other circuits (such as, for example, control circuitry, design-for-test circuitry, compensation circuitry, dynamic phase-shift circuitry, and other circuitry). The pre-scale divide counter for each of PLL0 and PLL1 is arranged to receive an input reference clock (RefClk) and to output a lower-frequency reference clock ($F_{ref}$) which is fed to the PLL core.

The circuits within the PLL core may include, for example, a phase frequency detector (PFD), a charge pump (CP), a loop filter (LF), a voltage-controlled oscillator (VCO), one or more dividers, and other circuits, such as a lock detection circuit. The PFD outputs "up" and "down" signals to the CP. If the CP receives an up signal, current is driven into the LF. If the CP receives a down signal, current is drawn from the LF. The LF effectively converts these signals to a control voltage that is used to bias the VCO. The VCO oscillates at a higher or lower frequency based on the control voltage. This affects the phase and frequency of the feedback clock ($F_{FB}$) which is fed back into the phase frequency detector. A feedback divide counter (÷m) may be inserted into the feedback loop to increase the VCO frequency above the frequency of the reference clock ($F_{ref}$). Each PLL core may include circuitry such that it may be configured as either an integer PLL or a fractional PLL. For example, to implement a fractional PLL, the circuitry may be configured to dynamically change the value m of the feedback divide counter during a locked state. Alternate implementations of the PLL core may be utilized.

The various other circuit blocks may include dynamic partial reconfigurable input/output (DPRIO) circuitry and various output interface blocks. The DPRIO circuitry may include a first DPRIO circuit block 502-0 arranged to control reconfigurable bits in PLL0 and a second DPRIO circuit block 502-1 arranged to control reconfigurable bits in PLL1. The output interface blocks 530 may include, for example, post-scale divide counters, low voltage differential signal circuitry, memory interface system circuitry, PLL external clock output circuitry, and other output interface blocks.

Figure 6:
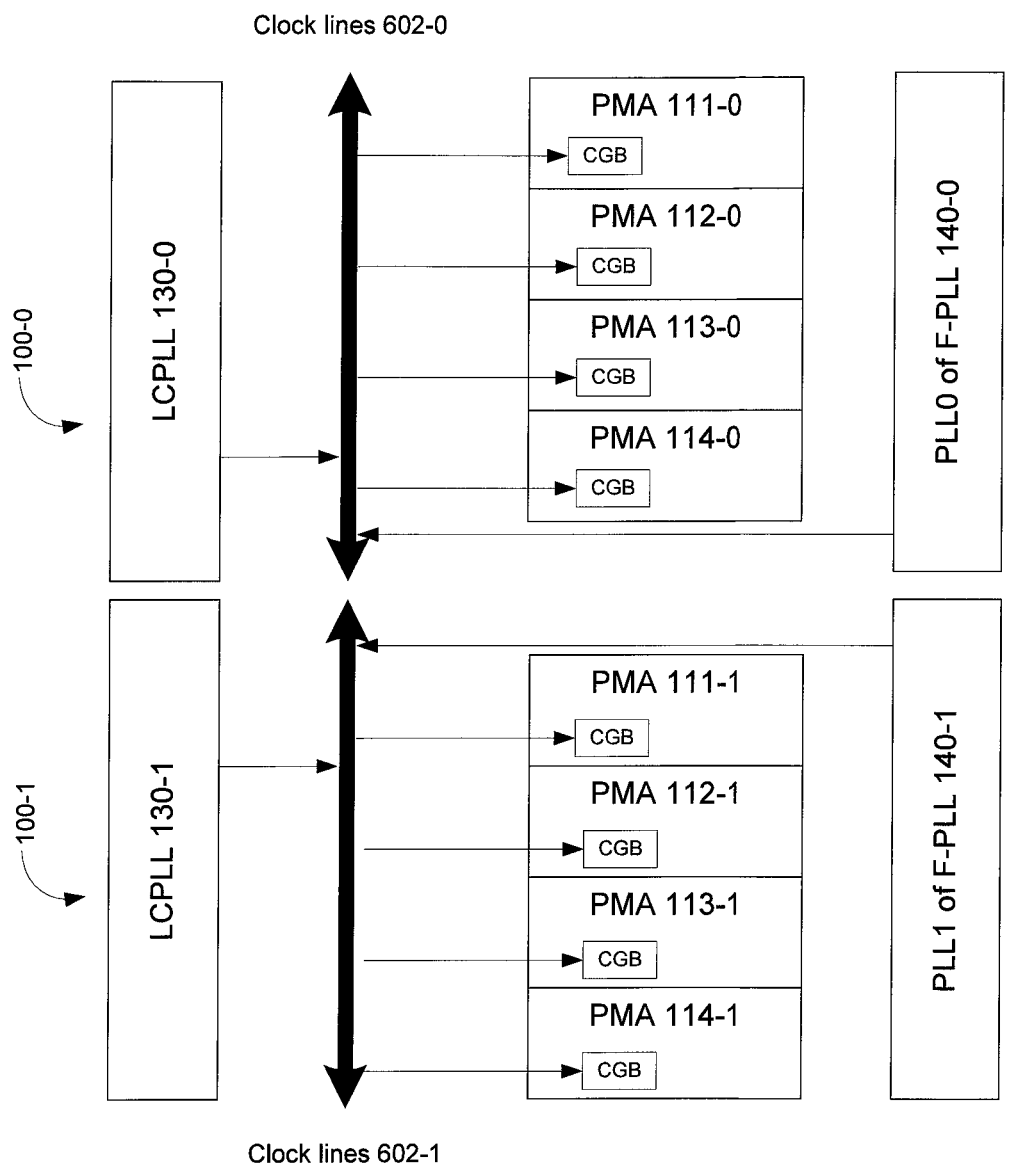
FIG. 6 shows an example clock network for distributing the outputs of the PLL circuits in accordance with an embodiment of the invention.
Figure 7:
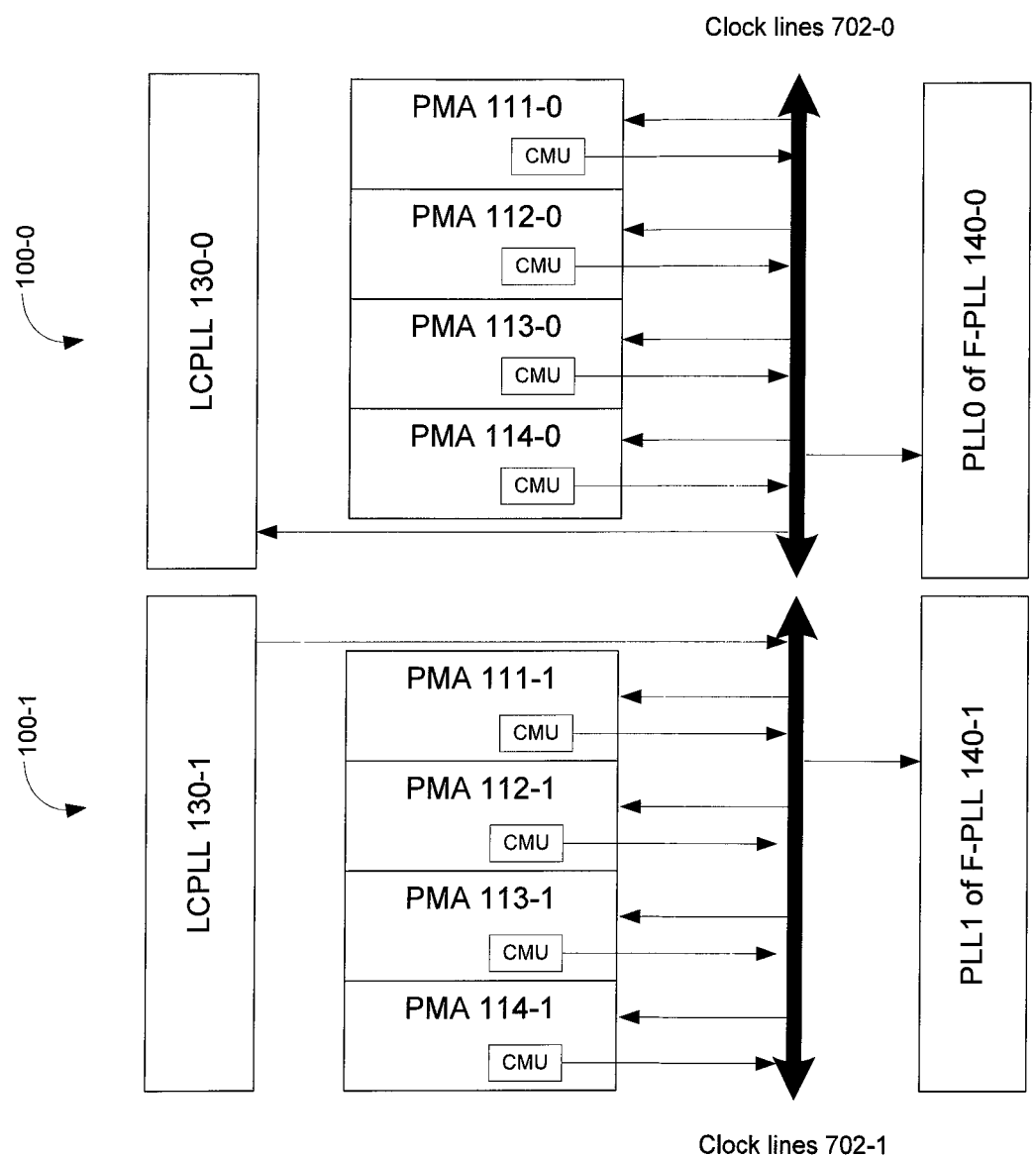
FIG. 7 shows an example clock network for distributing the outputs of the clock multiplier units in accordance with an embodiment of the invention.

FIG. 6 shows an example clock network for distributing the outputs of the PLL circuits in accordance with an embodiment of the invention, and FIG. 7 shows an example clock network for distributing the outputs of the clock multiplier units in accordance with an embodiment of the invention. While FIGS. 6 and 7 depict example clock networks interconnecting the PLL and PMA channel circuits, various other clock networks may be used.

Shown in FIGS. 6 and 7 are PLL and PMA circuitry for two adjacent four-channel HSSI modules (100-0 and 100-1). The top module 100-0 includes a first PLL of a fracture-able PLL (PLL0 of F-PLL) 140-0, and the bottom module 100-1 includes a second PLL of a fracture-able PLL (PLL1 of F-PLL) 140-1.

The example clock network depicted in FIG. 6 includes a first set of clock lines 602-0 for the top module 100-0, and a second set of clock lines 602-1 for the bottom module 100-1. The clock lines 602-0 may receive outputs from the LCPLL 130-0 and PLL0 140-0 of the top module 100-0, and the clock lines 602-1 may receive outputs from the LCPLL 130-1 and PLL1 140-1 of the bottom module 100-1. As further depicted, the clock generation block (CGB) in each PMA channel circuit (111-0, 112-0, 113-0, and 114-0) in the top module 100-0 may be configured to receive a clock signal from a selected line of the clock lines 602-0, and the CGB in each PMA channel circuit (111-1, 112-1, 113-1, and 114-1) in the bottom module 100-1 may be configured to receive a clock signal from a selected line of the clock lines 602-1.

The example clock network depicted in FIG. 7 includes a first set of clock lines 702-0 for the top module 100-0, and a second set of clock lines 702-1 for the bottom module 100-1. The clock lines 702-0 may receive clock signal outputs from the clock multiplier unit (CMU) in each PMA channel circuit (111-0, 112-0, 113-0, and 114-0) in the top module 100-0, and the clock lines 702-1 may receive clock signal outputs from the CMU in each PMA channel circuit (111-1, 112-1, 113-1, and 114-1) in the bottom module 100-1. Each of the LCPLL 130-0 and the PLL0 140-0 in the top module 100-0 may be configured to receive a clock signal from a selected line of the clock lines 702-0, and each of the LCPLL 130-1 and the PLL1 140-1 in the top module 100-1 may be configured to receive a clock signal from a selected line of the clock lines 702-1.

Figure 8:
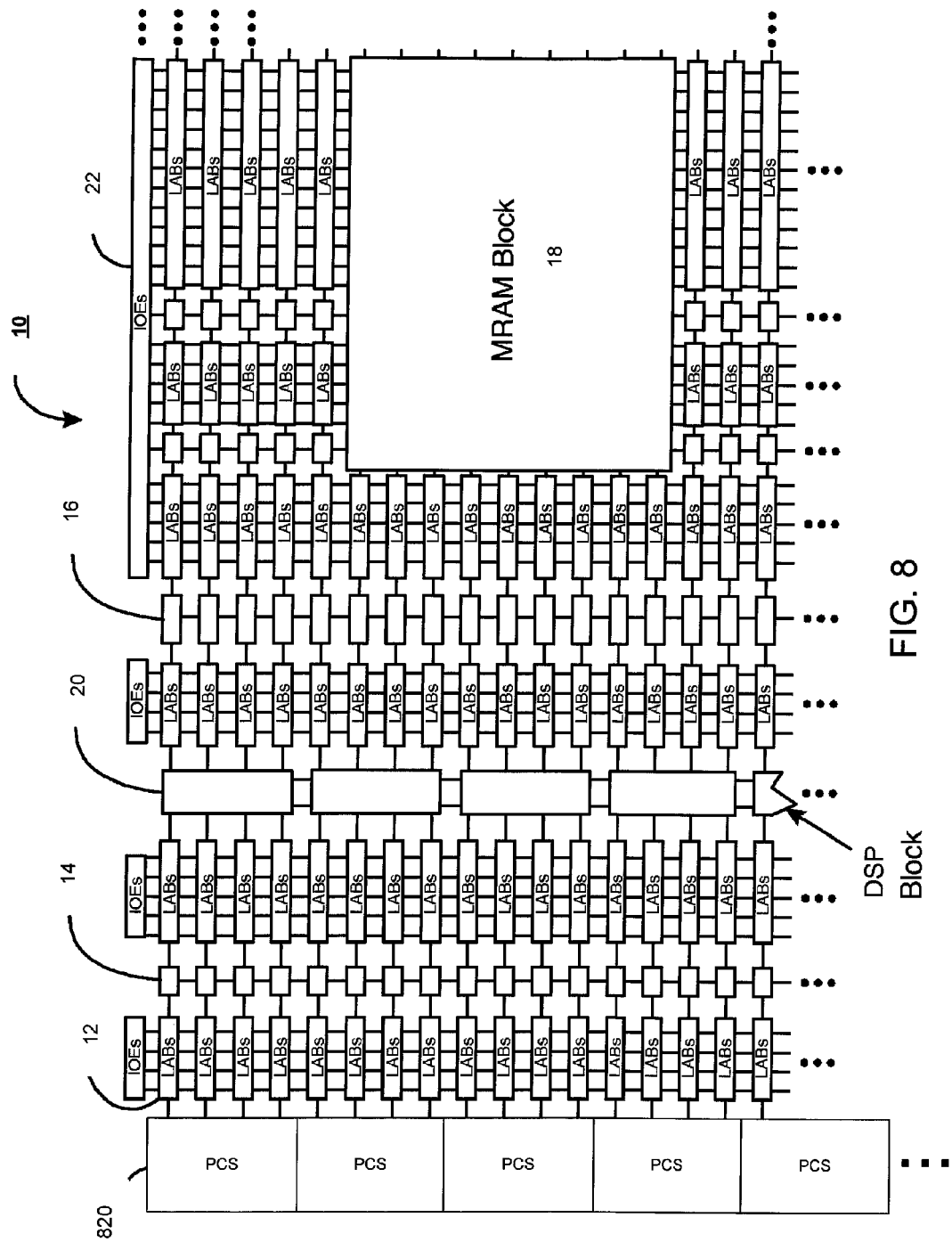
FIG. 8 is a simplified partial block diagram of an exemplary field programmable gate array (FPGA) that may be configured to implement an embodiment of the present invention.

FIG. 8 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10.

The above-discussed array of PMA/PCS channels 820 may be arranged as shown, for example, with each PCS channel circuit being coupled to several LABs.

It is to be understood that FPGA 10 is described herein for illustrative purposes only and that the present invention can be implemented in many different types of PLDs, FPGAs, and ASICs.

Figure 9:
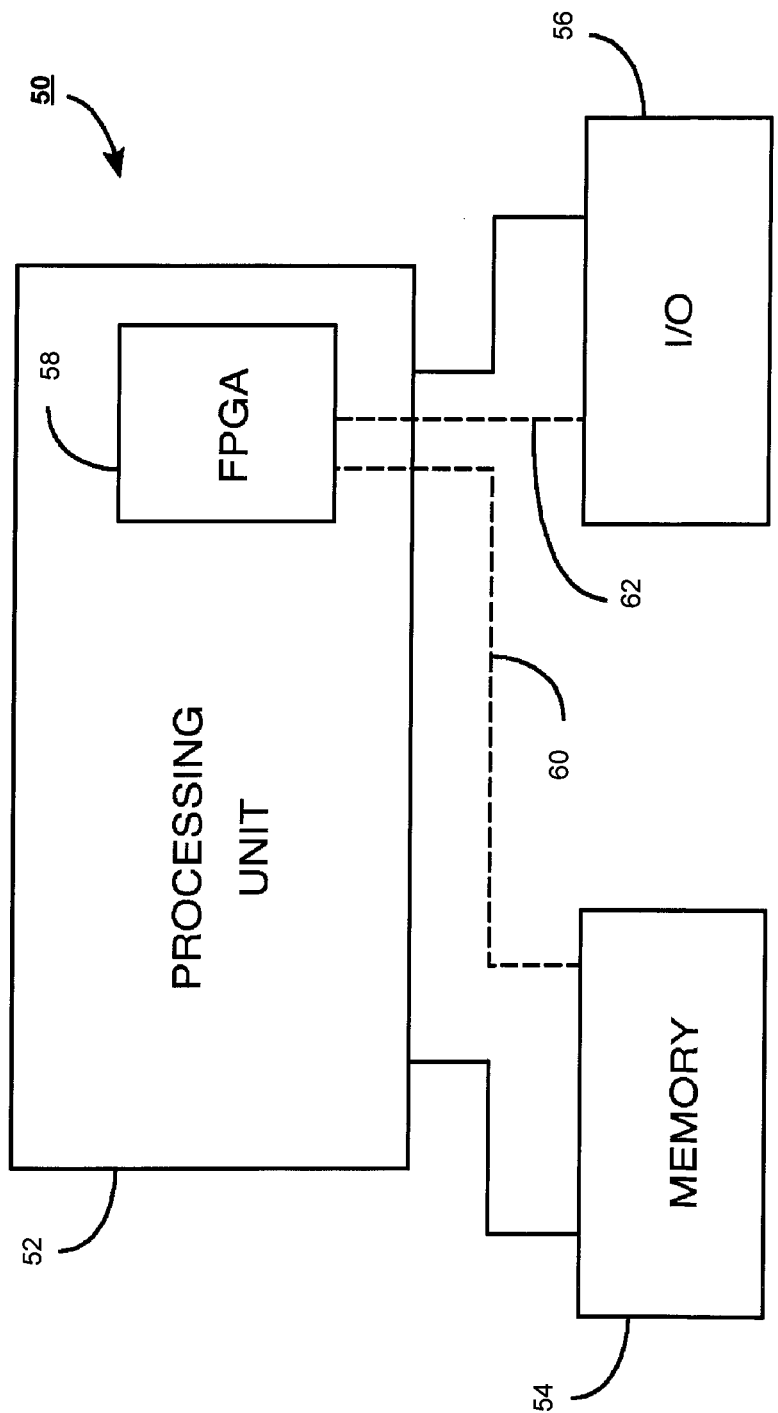
FIG. 9 shows a block diagram of an exemplary digital system that may employ apparatus and methods disclosed herein.

FIG. 9 shows a block diagram of an exemplary digital system 50 that may employ apparatus and methods disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit comprising:
   a plurality of four-channel serial interface modules, wherein each of the plurality of four-channel serial interface modules includes
      a first physical medium attachment (PMA) channel circuit,
      a second PMA channel circuit adjacent to the first PMA channel circuit,
      a third PMA channel circuit adjacent to the second PMA channel circuit,
      a fourth PMA channel circuit adjacent to the third PMA channel circuit, and
      at least one phase-locked loop (PLL) circuit which is programmably coupled to each of the first, second, third and fourth PMA channel circuits.

2. The integrated circuit of claim 1, wherein each of the plurality of four-channel serial interface modules further includes
   a first physical coding sub-layer (PCS) channel circuit programmably coupled to communicate with the first PMA channel circuit;
   a second PCS channel circuit adjacent to the first PCS channel circuit in the physical layout of the integrated circuit and programmably coupled to communicate with the second PMA channel circuit;
   a third PCS channel circuit adjacent to the second PCS channel circuit in the physical layout of the integrated circuit and programmably coupled to communicate with the third PMA channel circuit; and
   a fourth PCS channel circuit adjacent to the third PCS channel circuit in the physical layout of the integrated circuit and programmably coupled to communicate with the fourth PMA channel circuit.

3. The integrated circuit of claim 1, wherein said at least one PLL circuit includes a first PLL circuit and a second PLL circuit.

4. The integrated circuit of claim 3, wherein the PMA channel circuits of at least one four-channel serial interface module are arranged between the first and second PLL circuits in the physical layout of the integrated circuit.

5. The integrated circuit of claim 4, wherein the second PLL circuit is arranged in each of the plurality of four-channel serial interface modules between the PMA channel circuits and the PCS channel circuits in the physical layout of the integrated circuit.

6. The integrated circuit of claim 4, wherein the second PLL circuit comprises a fracture-able PLL circuit.

7. The integrated circuit of claim 5, wherein the first PLL circuit comprises a low-jitter PLL circuit.

8. The integrated circuit of claim 1, wherein said at least one PLL circuit comprises a fracture-able LC-oscillator-based PLL circuit, and wherein the PMA channel circuits are arranged in each of the plurality of four-channel serial interface modules between the fracture-able LC-oscillator-based PLL circuit and the PCS channel circuits in the physical layout of the integrated circuit.

9. The integrated circuit of claim 1, wherein each of the first, second, third and fourth PMA channel circuits is programmable to one of the data-channel configuration and the clock-multiplier-unit configuration.

10. The integrated circuit of claim 9, wherein each of the second and third channel circuits has a reach of N channels when in the clock-multiplier-unit configuration, where N is at least two.

11. The integrated circuit of claim 10, wherein N is a multiple of four.

12. The integrated circuit of claim 10, wherein N is six.

13. The integrated circuit of claim 9, wherein each of the first and fourth channel circuits has a reach of one channel when in the clock-multiplier-unit configuration.

14. A four-channel serial interface circuit module comprising:
   a first physical medium attachment (PMA) channel circuit;
   a second PMA channel circuit adjacent to the first PMA channel circuit;
   a third PMA channel circuit adjacent to the second PMA channel circuit;
   a fourth PMA channel circuit adjacent to the third PMA channel circuit;
   a first physical coding sub-layer (PCS) channel circuit programmably coupled to communicate with the first PMA channel circuit;
   a second PCS channel circuit adjacent to the first PCS channel circuit in the physical layout of the integrated circuit and programmably coupled to communicate with the second PMA channel circuit;
   a third PCS channel circuit adjacent to the second PCS channel circuit in the physical layout of the integrated circuit and programmably coupled to communicate with the third PMA channel circuit; and
   a fourth PCS channel circuit adjacent to the third PCS channel circuit in the physical layout of the integrated circuit and programmably coupled to communicate with the fourth PMA channel circuit,
   wherein at least two of the first, second, third and fourth PMA channel circuits is programmable to one configuration of a set of configurations consisting of a data-channel configuration and a clock-multiplier-unit configuration.

15. The four-channel serial interface circuit module of claim 14, further comprising a first PLL circuit and a second PLL circuit, wherein the PMA channel circuits are arranged between the first PLL circuit and the second PLL circuit in the physical layout of the integrated circuit.

16. The four-channel serial interface circuit module of claim 15, wherein the second PLL circuit is arranged between the PMA channel circuits and the PCS channel circuits, and wherein the second PLL circuit comprises a fracture-able PLL circuit.

17. The four-channel serial interface circuit module of claim 14, wherein each of the second and third PMA channel circuits has a reach of N channels when in the clock-multiplier-unit configuration, where N is at least two.

18. The four-channel serial interface circuit module of claim 14, wherein each of the first and fourth channel circuits has a reach of one channel when in the clock-multiplier-unit configuration.

19. A method of configuring an integrated circuit, the method comprising configuring a plurality of four-channel serial interface modules to implement a plurality of different serial interface protocols, wherein each of the plurality of four-channel serial interface modules has four physical medium attachment (PMA) channel circuits, four physical coding sub-layer (PCS) circuits programmably coupled to the four PMA channel circuits, and at least one phase-locked loop (PLL) circuit which is programmably coupled to the four PMA channel circuits.

20. The method of claim 19 further comprising:
    configuring at least one PMA channel circuit to a data-channel configuration; and
    configuring at least one PMA channel circuit to a clock-multiplier-unit configuration.

* * * * *